(12) United States Patent
Kodani et al.

(10) Patent No.: US 9,407,427 B2
(45) Date of Patent: Aug. 2, 2016

(54) TECHNIQUE FOR OPTIMIZING THE PHASE OF A DATA SIGNAL TRANSMITTED ACROSS A COMMUNICATION LINK

(71) Applicant: NVIDIA CORPORATION, Santa Clara, CA (US)

(72) Inventors: Gregory Kodani, San Jose, CA (US); Guatam Bhatia, Mountain View, CA (US); Peter C. Mills, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 46 days.

(21) Appl. No.: 13/772,157

(22) Filed: Feb. 20, 2013

(65) Prior Publication Data

US 2014/0233612 A1 Aug. 21, 2014

(51) Int. Cl.
| | |
|---|---|
| *H04L 7/00* | (2006.01) |
| *H03L 7/00* | (2006.01) |
| *H04L 5/14* | (2006.01) |
| *G06F 13/42* | (2006.01) |
| *H04L 7/033* | (2006.01) |

(52) U.S. Cl.
CPC .......... *H04L 7/0083* (2013.01); *G06F 13/4295* (2013.01); *H03L 7/00* (2013.01); *H04L 5/1423* (2013.01); *H04L 7/0025* (2013.01); *H04L 7/033* (2013.01)

(58) Field of Classification Search
CPC ........... H04B 1/48; H04J 3/0685; H04L 5/16; H04L 7/0083; H04L 7/02; H04L 7/033; H04L 5/1423; H04L 7/0025; G06F 13/4295; H03L 7/00
USPC .................. 375/219, 355, 359, 371, 373, 376
See application file for complete search history.

(56) References Cited

U.S. PATENT DOCUMENTS

| | | | |
|---|---|---|---|
| 7,159,136 B2 * | 1/2007 | Best et al. | ...................... 713/401 |
| 8,274,339 B2 | 9/2012 | Fan et al. | |
| 2002/0094786 A1 * | 7/2002 | Berliner et al. | .............. 455/67.4 |
| 2009/0310667 A1 * | 12/2009 | Lee et al. | ....................... 375/233 |
| 2011/0099410 A1 * | 4/2011 | Yin et al. | ....................... 713/503 |
| 2013/0249612 A1 * | 9/2013 | Zerbe et al. | ................... 327/161 |

FOREIGN PATENT DOCUMENTS

TW    201145916 A    12/2011

* cited by examiner

*Primary Examiner* — David B. Lugo
(74) *Attorney, Agent, or Firm* — Artegis Law Group, LLP (57) ABSTRACT

A first transceiver is configured to transmit a first data signal to a second transceiver across a communication link. The second transceiver maintains clock data recovery (CDR) lock with the first signal by adjusting a sampling clock configured to sample the first data signal. When the communication link reverses directions, the second transceiver is configured to transmit a second data signal to the first transceiver with the phase of that second data signal adjusted based on the adjustments made to the sampling clock.

20 Claims, 4 Drawing Sheets

TECHNIQUE FOR OPTIMIZING THE PHASE OF A DATA SIGNAL TRANSMITTED ACROSS A COMMUNICATION LINK

BACKGROUND OF THE INVENTION

1. Field of the Invention

The present invention generally relates to computer hardware and, more specifically, to a technique for optimizing the phase of a data signal transmitted across a communication link.

2. Description of the Related Art

A modern computer chip, such as a central processing unit (CPU) or a parallel processing unit (PPU), usually includes multiple chip components configured to communicate with one another via a communication link. For example, a given chip component could include a transmitter configured to transmit data signals across the communication link to a receiver included within another chip component. A conventional receiver oftentimes implements clock data recovery (CDR) hardware in order to recover timing information from a data signal received from a transmitter across the communication link. With the recovered timing information, the receiver is capable of sampling the received data signal at precise intervals via a sampling clock, and may thus re-create the original, transmitted signal.

When implementing CDR in this fashion, the transmitter usually performs an initial training routine with the receiver in order to calibrate the CDR hardware associated with the receiver and establish CDR lock on the received data signal. The CDR hardware may then continuously optimize the sampling clock phase in order to maintain CDR lock after the initial training routine. Such continuous optimization is required because the phase of the received data signal may vary over time (e.g., due to physical fluctuations associated with the transmitter and/or the communication link itself), and so the CDR hardware must adjust the phase of the sampling clock in order to track those phase variations.

The CDR-based approach discussed above may also be implemented with bi-directional communication links that allow data to be transmitted in either direction between chip components. For example, a transceiver within a given chip component could be configured to transmit data signals to or receive data signals from another transceiver within another chip component across a bi-directional communication link. In this situation, each chip component could include CDR hardware configured to recreate timing information associated with a received data signal. Each chip component could also perform the initial training routine discussed above in order to establish CDR lock with a corresponding received data signal, and then continuously optimize the sampling clock phase to maintain that CDR lock. This approach is well suited for transceivers that receive data signals frequently, because such transceivers are able to continuously optimize the sampling clock phase and, thus, maintain CDR lock.

However, transceivers that receive data signals infrequently cannot continuously optimize the sampling clock phase, and, thus, cannot maintain CDR lock. When a given transceiver loses CDR lock, that transceiver must perform the training routine again in order to calibrate the CDR hardware and regain CDR lock. This situation is problematic because the training routine may require a significant amount of time to perform, and the communication link cannot transport any useful data during that period of time. Moreover, performing the training routine requires excess power, and so the overall power requirements of the communication link and/or associated transceivers is increased.

Accordingly, what is needed in the art is a more effective technique for maintaining CDR lock in a communication link.

SUMMARY OF THE INVENTION

One embodiment of the invention includes a computer-implemented method for transmitting data to a first transceiver from across a communication link, including receiving a first data signal across the communication link from the first transceiver, sampling a first portion of the first data signal to produce sampled data, determining a first phase adjustment to be applied to a second portion of the first data signal to compensate for a phase variation associated with the communication link based on the sampled data, applying a second phase adjustment to a second data signal based on the first phase adjustment to also compensate for the phase variation associated with the communication link, and transmitting the second data signal across the communication link to the first transceiver.

One advantage of the present invention is that a second transceiver is capable of facilitating the first transceiver in maintaining clock data recovery (CDR) lock on the second data signal by accounting for phase variations caused by changes in the physical properties of the communication link. Accordingly, the first and second transceivers do not need to perform superfluous calibration routines with one another.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

Figure 1:
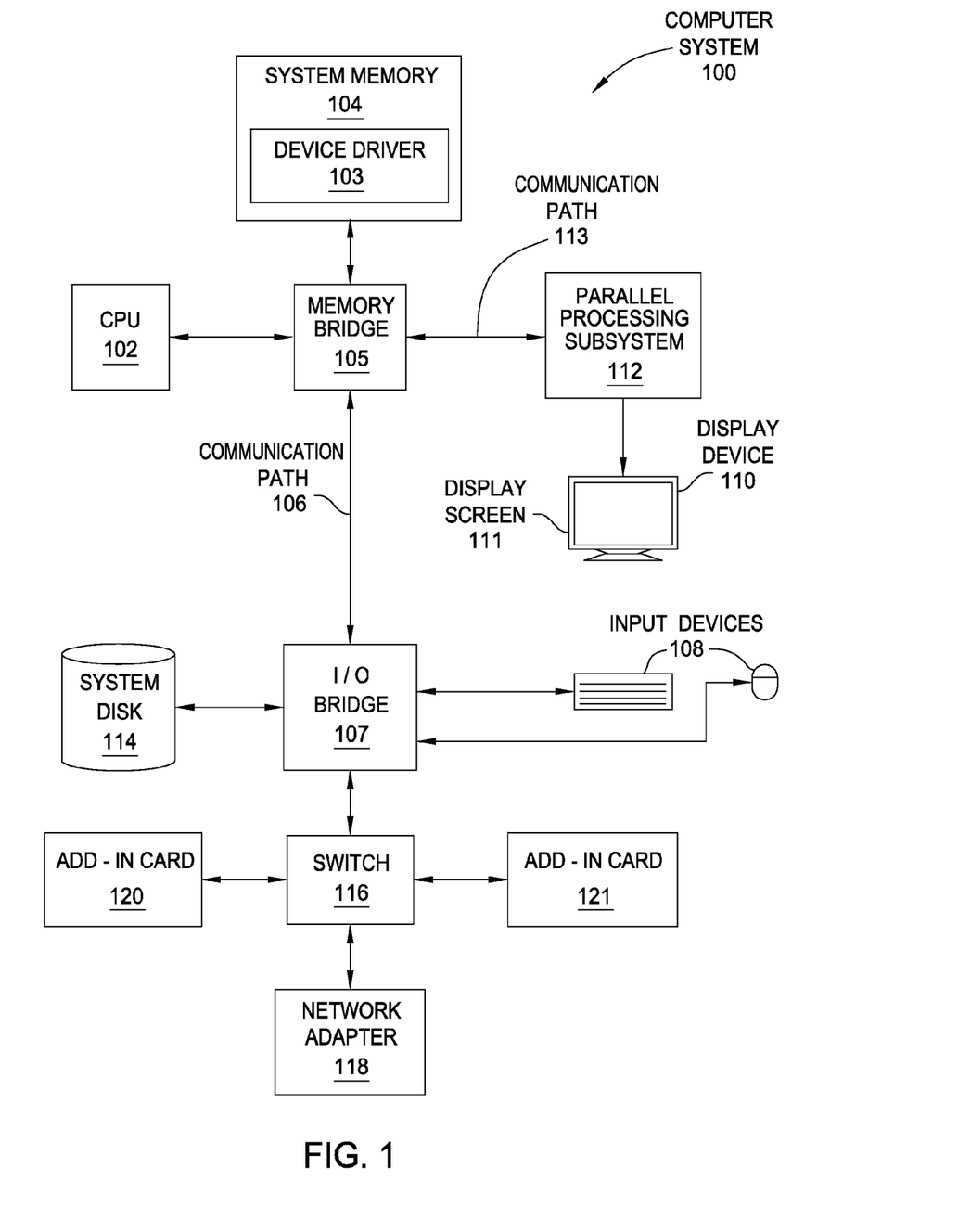
FIG. 1 is a block diagram that illustrates a computer system configured to implement one or more aspects of the present invention.

FIG. 1 is a block diagram that illustrates a computer system 100 configured to implement one or more aspects of the present invention. Computer system 100 includes a central processing unit (CPU) 102 and a system memory 104 that includes a device driver 103. CPU 102 and system memory 104 communicate via an interconnection path that may include a memory bridge 105. Memory bridge 105, which may be, e.g., a Northbridge chip, is connected via a bus or other communication path 106 (e.g., a HyperTransport link) to an input/output (I/O) bridge 107. I/O bridge 107, which may be, e.g., a Southbridge chip, receives user input from one or more user input devices 108 (e.g., keyboard, mouse) and forwards the input to CPU 102 via path 106 and memory bridge 105. A parallel processing subsystem 112 is coupled to memory bridge 105 via a bus or other communication path 113 (e.g., a peripheral component interconnect (PCI) express, Accelerated Graphics Port (AGP), or HyperTransport link); in one embodiment parallel processing subsystem 112 is a graphics subsystem that delivers pixels to a display device 110 (e.g., a conventional cathode ray tube (CRT) or liquid crystal display (LCD) based monitor). A system disk 114 is also connected to I/O bridge 107. A switch 116 provides connections between I/O bridge 107 and other components such as a network adapter 118 and various add-in cards 120 and 121. Other components (not explicitly shown), including universal serial bus (USB) or other port connections, compact disc (CD) drives, digital video disc (DVD) drives, film recording devices, and the like, may also be connected to I/O bridge 107. Communication paths interconnecting the various components in FIG. 1 may be implemented using any suitable protocols, such as PCI, PCI Express (PCIe), AGP, HyperTransport, or any other bus or point-to-point communication protocol(s), and connections between different devices may use different protocols as is known in the art.

In one embodiment, the parallel processing subsystem 112 incorporates circuitry optimized for graphics and video processing, including, for example, video output circuitry, and constitutes a graphics processing unit (GPU). In another embodiment, the parallel processing subsystem 112 incorporates circuitry optimized for general purpose processing, while preserving the underlying computational architecture, described in greater detail herein. In yet another embodiment, the parallel processing subsystem 112 may be integrated with one or more other system elements, such as the memory bridge 105, CPU 102, and I/O bridge 107 to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For instance, in some embodiments, system memory 104 is connected to CPU 102 directly rather than through a bridge, and other devices communicate with system memory 104 via memory bridge 105 and CPU 102. In other alternative topologies, parallel processing subsystem 112 is connected to I/O bridge 107 or directly to CPU 102, rather than to memory bridge 105. In still other embodiments, I/O bridge 107 and memory bridge 105 might be integrated into a single chip. Large embodiments may include two or more CPUs 102 and two or more parallel processing systems 112. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

In one embodiment of the present invention, parallel processing subsystem 112 includes one or more parallel processing unit (PPUs) each of which includes one or more chip components. The chip components within a given PPU could represent, for example, portions of graphics processing hardware configured to write data to or read data from other chip components within the PPU. Alternatively, the chip components within a given PPU could represent, in another example, portions of general purpose computing hardware configured to write data to or read data from other chip components within the PPU. Any given set of chip components within a PPU may be coupled together via a communication link, and each such chip component may include a transceiver configured to implement a technique for optimizing the phase of a data signal to be transmitted, as discussed in greater detail below in conjunction with FIG. 2.

Optimizing the Phase of a Data Signal

Figure 2:
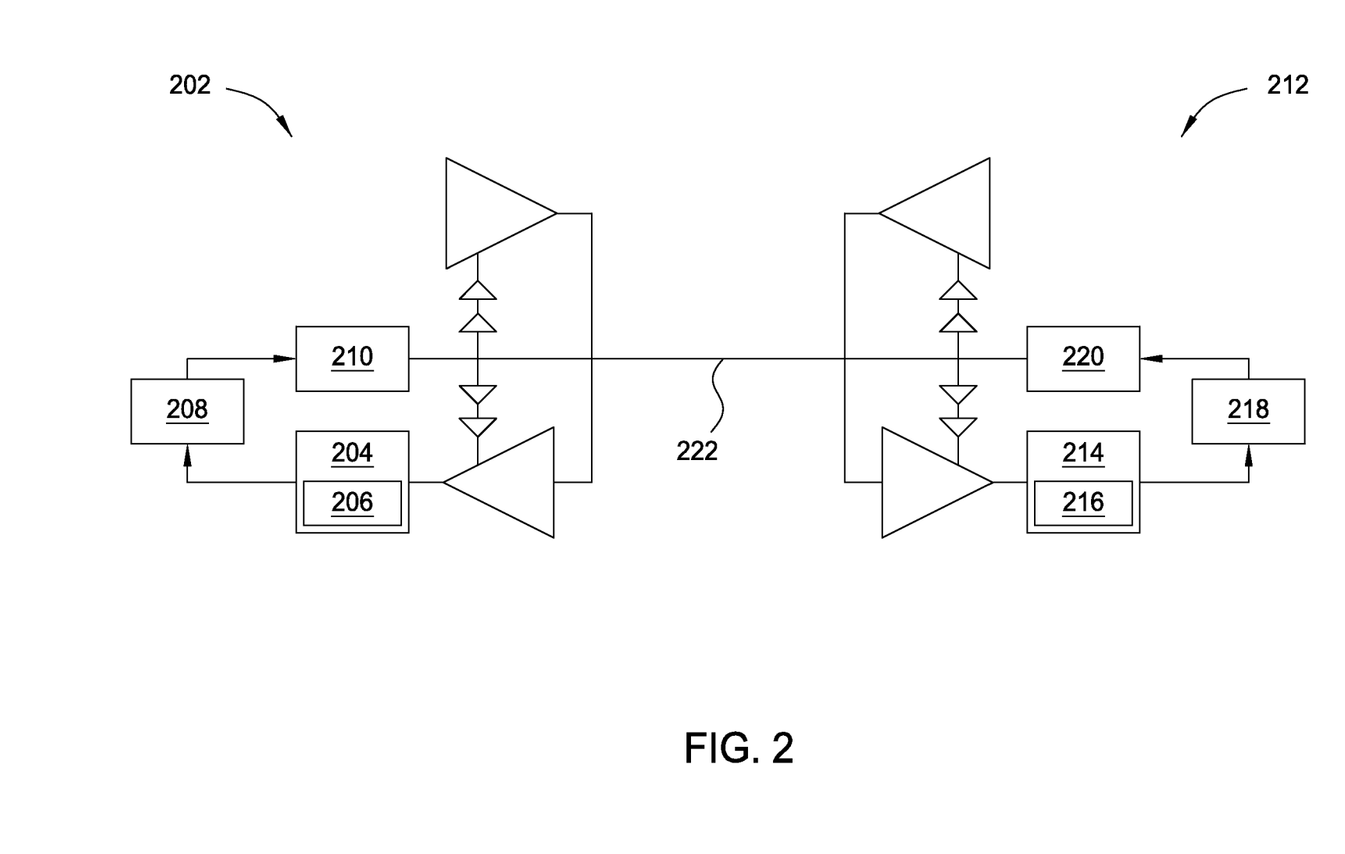
FIG. 2 is a block diagram that illustrates transceivers configured to communicate with one another, according to one embodiment of the present invention.

FIG. 2 is a block diagram that illustrates a transceiver 202 configured to communicate with another transceiver 212 across a communication link 222, according to one embodiment of the present invention. In practice, transceivers 202 and 212 may each reside within different integrated circuits (ICs) included within computer system 100 shown in FIG. 1. For example, transceiver 202 could reside within CPU 102 while transceiver 212 could reside within a PPU within parallel processing subsystem 112. Alternatively, transceivers 202 and 212 may both reside within a given integrated circuit that resides within computer system 100. Transceivers 202 and 212 are configured to transmit data signals to and receive data signals from one another via communication link 222.

Communication link 222 may be a high-speed serial data bus configured to transport data signals between transceivers 202 and 212. In one embodiment of the present invention, communication link 222 is a half-duplex communication link that includes a single data pathway, and a given one of transceivers 202 or 212 may either transmit data to or receive data from the other transceiver across that data pathway. In another embodiment, communication link 222 may be a full-duplex communication link that includes multiple data pathways, and transceivers 202 and 212 may be configured to both transmit data to and receive data from one another simultaneously. In practice, communication link 222 may be a bidirectional communication link configured to transport data signals from transceiver 202 to transceiver 212 and then reverse directions and transport data signals from transceiver 212 to transceiver 202.

When communication link 222 transports data signals between transceivers 202 and 212 for a significant period of time, the physical properties of that communication link may change. These changes may affect various characteristics associated with the data signals transported across communication link 222. For example, when communication link 222 includes a set of wires configured to transport data signals as periodic electrical pulses, the temperature of those wires may increase over time, thereby causing the phase of those electrical signals to vary. The physical properties of communication link 222, and the data signals transported by that communication link, may be influenced by a wide variety of factors. Those factors may include power supply levels for transceivers coupled to communication link 222, power supply levels for sample clocks within those transceivers, process variations associated with the transportation of data signals across communication link 222, and so forth. In general, communication link 222 is subject to a wide variety of process-temperature-voltage (PVT) variations.

Transceivers 202 and 212 may account for these variations by implementing specialized hardware configured to adjust the phase of received data signals and/or adjust the phase of data signals to be transmitted. Transceivers 202 and 212 may also be configured to compute default phase adjustments that are applied to received data signals and/or data signals to be transmitted by performing a calibration routine with one another. As shown, transceiver 202 includes a clock data recovery (CDR) unit 204 that includes a sampling clock 206, a phase adjustment accumulator 208, and a phase interpolator 210. Likewise, transceiver 212 includes a CDR unit 214 that includes a sampling clock 216, a phase adjustment accumulator 218, and a phase interpolator 220.

When transceiver 202 receives a data signal from transceiver 212, CDR unit 204 is configured to implement sampling clock 206 in order to sample the received signal at specific intervals. CDR unit 204 is also configured to continuously adjust the phase of sampling clock 206 in order to maintain optimum sampling position and CDR lock on the received data signal, thereby tracking phase variations associated with that data signal. Again, such phase variations may be caused by changes in the physical properties associated with communication link 220 or with transceiver 212, such as e.g. PVT variations. Phase adjustment accumulator 208 is configured to record the phase adjustments made by CDR unit 204 to sampling clock 206. Phase interpolator 210 is configured to apply those phase adjustments to data signals transmitted from transceiver 202 to transceiver 212, thereby reducing the effects of the changes in physical properties associated with communication link 222 on the transmitted data signals.

Transceiver 212 is configured similarly to transceiver 202. In particular, CDR unit 214 is configured to implement sampling clock 216 in order to sample a received data signal at specific intervals, and to also continuously adjust the phase of sampling clock 216 in order to maintain optimum sampling position and CDR lock on the received data signal, thereby tracking phase variations associated with that data signal. Phase adjustment accumulator 218 is configured to record the phase adjustments made by CDR unit 214 to sampling clock 216. Phase interpolator 220 is configured to then apply those phase adjustments to signals transmitted from transceiver 212 to transceiver 202.

With transceivers 202 and 212 configured in the fashion described above, each such transceiver is capable of recording the phase adjustments required to maintain optimum sampling clock position and CDR lock on a received data signal. A given transceiver may then apply the corresponding phase adjustments to data signals to be transmitted. With this approach, each of transceivers 202 and 212 is capable of maintaining CDR lock in situations where CDR lock would normally be lost.

For example, in situations where transceiver 202 transmits a first data signal to transceiver 212 for an extended period of time, CDR unit 204 may not receive any data during that period of time, and, thus, may not be able to continuously adjust the phase of sampling clock 206 in the fashion described above. Consequently, CDR unit 204 may not be able to track phase variations resulting from changes in the physical properties of communication link 222. However, CDR unit 214 continuously adjusts the phase of sampling clock 216 in order to maintain optimum sampling position and CDR lock on the first data signal received from transceiver 202, thereby tracking those phase variations. When communication link 222 reverses directions, and transceiver 212 transmits a second data signal to transceiver 202, transceiver 212 applies those phase adjustments to the second signal, thereby accounting for the changes in the physical properties of communication link 222. Accordingly, the phase of sampling clock 206 within CDR unit 204 may be close to the optimum sampling position and CDR unit 204 may retain CDR lock despite not being able to perform continuous adjustments. The example described herein is also described in greater detail below in conjunction with FIGS. 3A-3C.

Figure 3A:
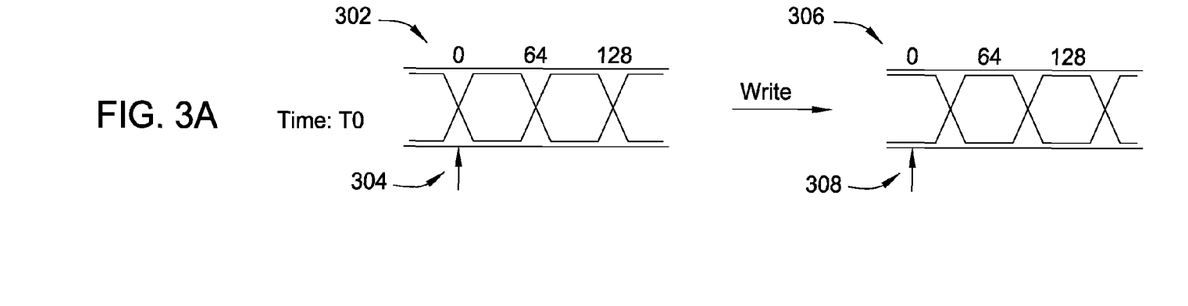
FIG. 3A-3C are conceptual illustrations of different timing diagrams associated with a data transfer operation, according to various embodiments of the present invention.

FIG. 3A is a conceptual illustration of a set of timing diagrams 302 and 306 associated with a data transfer operation, according to one embodiment of the present invention. As shown, timing diagram 302 reflects an eye pattern associated with a first signal to be transmitted at time T0 during a write operation perform by transceiver 202. Position 304 indicates the phase associated with the first data signal, and may represent an optimal sampling position for the first data signal. In this example, data signals are optimally sampled at clock edges, although other optimal sampling locations also fall within the scope of the present invention.

Timing diagram 306 reflects an eye pattern associated with the first signal received by transceiver 212. Position 308 indicates the sampling position of sampling clock 216 within CDR unit 214. As is shown, the sampling position of sampling clock 216 is non-optimal and position 308 is shifted by phase delta 310 relative to the optimal sampling position. Phase delta 310 could be a system delay caused by, e.g., PVT variations associated with communication link 222 or transceivers 202 and/or 212. CDR unit 214 is configured to adjust the phase of sampling clock 216 by phase delta 310 in order to maintain optimal sampling position and account for these variations, as discussed in greater detail below in conjunction with FIG. 3B.

Figure 3B:
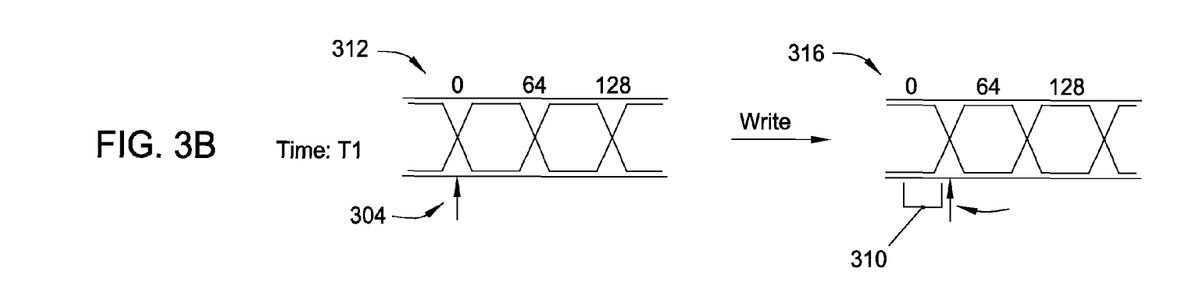

FIG. 3B is a conceptual illustration of a set of timing diagrams 312 and 316 associated with a data transfer operation, according to one embodiment of the present invention. As shown, timing diagram 312 reflects an eye pattern associated with the first signal discussed above in conjunction with FIG. 3A and timing diagram 316 indicates an eye pattern associated with the first signal received by transceiver 212. As also shown, CDR unit 214 has adjusted the sampling position of sampling clock 216 by phase delta 310 to reside at the optimal sampling position, shown in FIG. 3B as position 318. When CDR unit 214 adjusts the phase of sampling clock 216 to maintain optimal sampling position in the fashion discussed herein, phase adjustment accumulator 218 is configured to record those phase adjustments to be applied to data signals subsequently transmitted by transceiver 212, as discussed in greater detail below in conjunction with FIG. 3C.

Figure 3C:
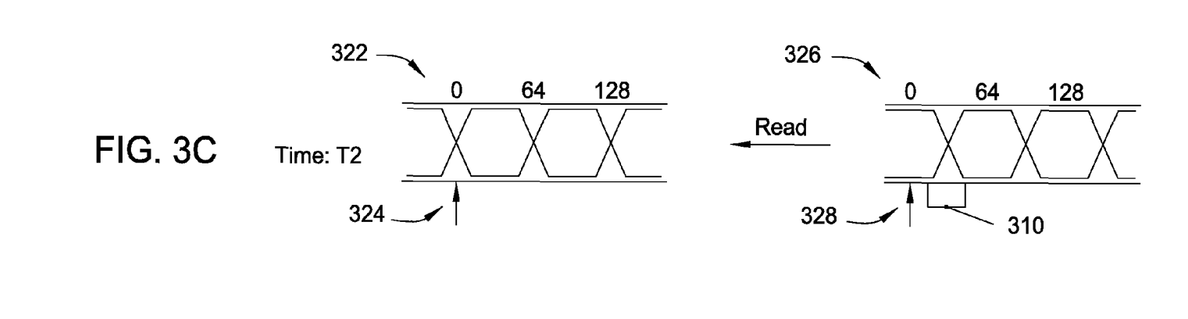

FIG. 3C is a conceptual illustration of a set of timing diagrams 322 and 326 associated with a data transfer operation, according to one embodiment of the present invention. As shown, timing diagram 326 reflects an eye pattern associated with a second data signal transmitted by transceiver 212 to transceiver 202 during a read operation at time T2. A significant amount of time may have elapsed between time T0 and time T2. Phase interpolator 220 is configured to adjust the phase of the second signal by phase delta 310 in order to account for the physical variations associated with communication link 222 that occurred during that time, mentioned above in conjunction with FIG. 3A. Phase delta 310 may have a given magnitude, and phase interpolator 220 may adjust the phase of the second signal by a positive or a negative phase delta 310 based on that given magnitude.

Timing diagram 322 reflects an eye pattern associated with the second data signal received by transceiver 202. Position 324 indicates the sampling position of sampling clock 206 within CDR unit 204. As is shown, the sampling position of sampling clock 216 is close to optimal, since transceiver 212 adjusted the phase of the second data signal to account for physical variations associated with communication link 222.

In this example, transceiver 202 is capable of maintaining CDR lock with transceiver 212 despite not having received data from transceiver 212 for a significant period of time. Accordingly, transceiver may avoid having to perform a training routine in order to re-calibrate sampling clock 206 within CDR unit 204.

Referring back now to FIG. 2, in one embodiment of the present invention, each of transceivers 202 and 212 is also configured to maintain a phase offset value that represents phase changes caused by hardware differences associated with transceivers 202 and 212. Those hardware differences could represent, for example, physical differences between data pathways associated with transceivers 202 and 212. When applying phase adjustments to data signals to be transmitted, either of transceivers 202 or 212 may also incorporate the phase offset value into those phase adjustments in order to account for the hardware differences. Transceivers 202 and 212 may also periodically perform a calibration routine in order to quantify the phase adjustments needed to account for those hardware differences. The calibration routine could involve, for example, transceivers 202 and 212 exchanging short data bursts with fast reversals of communication link 222. In another embodiment, each of transceivers 202 and 212 may implement the approaches discussed above after determining that the phase of a received data signal has varied by a threshold amount due to, e.g., PVT changes associated with communication link 222 or either of transceivers 202 or 212.

The approach described above in conjunction with FIG. 2 and described by way of example in conjunction with FIGS. 3A-3C is also discussed in greater detail below in conjunction with FIG. 4.

Figure 4:
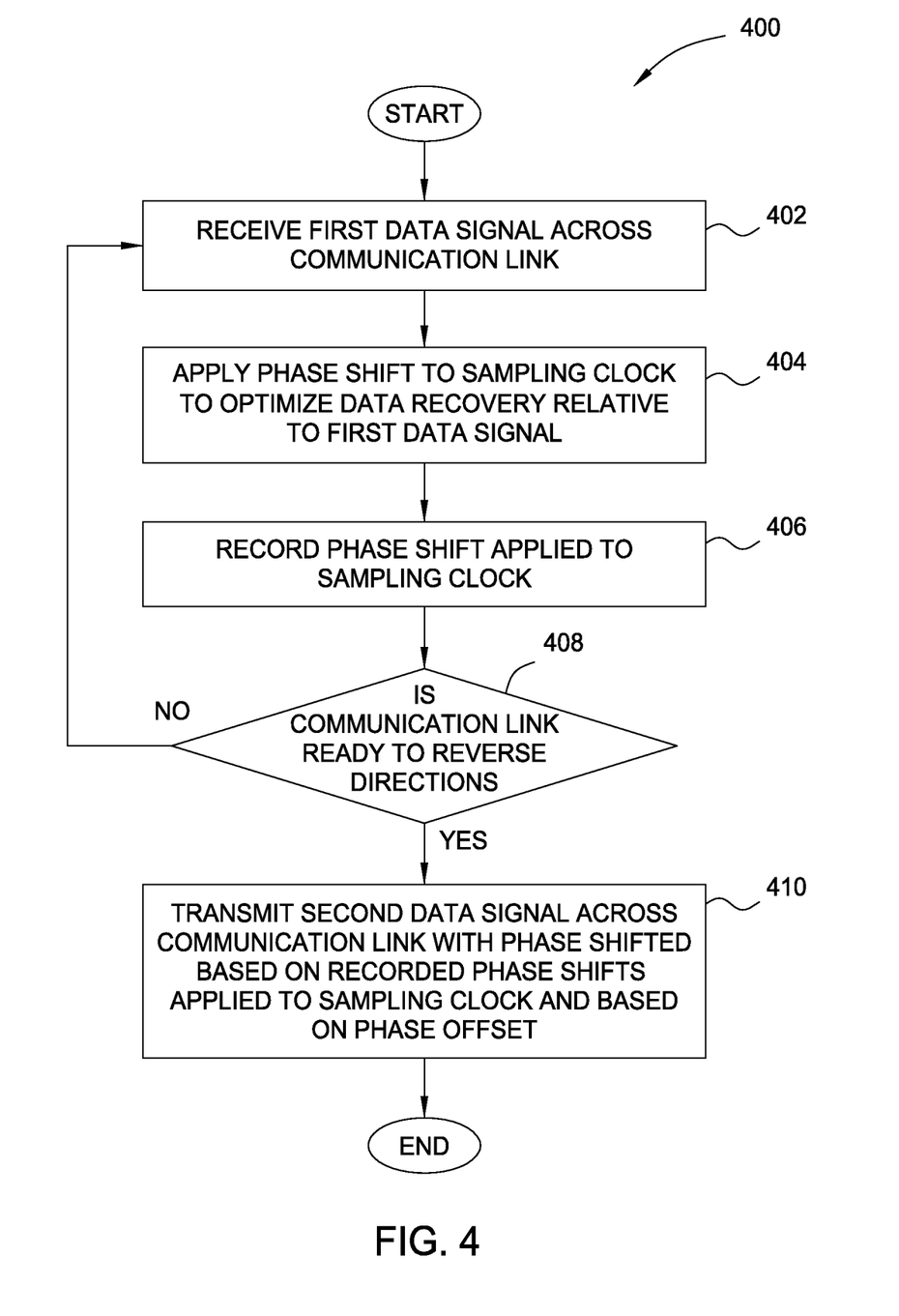
FIG. 4 is a flow diagram of method steps for optimizing the phase of a data signal transmitted across the communication link shown in FIG. 2, according to one embodiment of the present invention.

FIG. 4 is a flow diagram of method steps for optimizing the sampler clock position in the communication link shown in FIG. 2, according to one embodiment of the present invention. Although the method steps are described in conjunction with the systems of FIGS. 1 and 2, persons skilled in the art will understand that any system configured to perform the method steps, in any order, is within the scope of the present invention.

As shown, a method 400 begins at step 402, where CDR unit 214 within transceiver 212 receives a first data signal across communication link 222. The first data signal could be, e.g., a write operation initiated by transceiver 202. Communication link 222 is a high-speed bus configured to transport data signals between transceivers 202 and 212. In one embodiment of the present invention, communication link 222 is a half-duplex link that includes a single data pathway, and a given one of transceivers 202 or 212 may either transmit data to or receive data from the other transceiver across that data pathway. In practice, communication link 222 may transport data signals from transceiver 202 to transceiver 212, and may then reverse directions and transport data signals from transceiver 212 to transceiver 202. Sampling clock 216 within CDR unit 214 is configured to sample the first signal based on a sampling position associated with that sampling clock, where the sampling position reflects the phase of sampling clock 216.

At step 404, CDR unit 214 within transceiver 212 applies a phase shift to sampling clock 216 to optimize data recovery relative to the first data signal. CDR unit 214 is configured to continuously adjust the phase of sampling clock 206 in order to maintain optimum sampling position and CDR lock on the first data signal, thereby tracking phase variations associated with that data signal. Such phase variations may be caused by changes in the physical properties associated with communication link 220 or with transceiver 202, such as e.g. PVT variations.

At step 406, phase adjustment accumulator 218 within transceiver 212 records the phase adjustments applied to sampling clock 216 at step 404. Phase adjustment accumulator 218 may track the total phase adjustments applied to sampling clock 216 or may incrementally accumulate individual phase adjustments over time. At step 408, transceiver 212 determines whether communication link 222 is ready to reverse directions and transmit data signals from transceiver 212 to 202. If transceiver 212 determines that communication link 222 is not ready to reverse directions, then the method 400 returns to step 402 and proceeds as described above. If transceiver 212 determines that communication link 222 is ready to reverse directions, then the method 400 proceeds to step 410.

At step 410, phase interpolator 220 within transceiver 212 causes a second data signal to be transmitted across communication link 220 to transceiver 202 with the phase of that data signal shifted to reflect the phase adjustments applied to sampling clock 216 by CDR unit 214 at step 404. The method 400 then ends. When transceiver 202 receives the second signal, the phase of that signal may be sufficiently close to the optimal sampling position associated with sampling clock 206, allowing CDR unit 204 to maintain CDR lock with the second signal without performing a calibration routine.

In sum, a first transceiver is configured to transmit a first data signal to a second transceiver across a communication link. The second transceiver maintains clock data recovery (CDR) lock with the first signal by adjusting a sampling clock configured to sample the first data signal. When the communication link reverses directions, the second transceiver is configured to transmit a second data signal to the first transceiver with the phase of that second data signal adjusted based on the adjustments made to the sampling clock.

Advantageously, a transceiver is capable of facilitating another transceiver in maintaining clock data recovery (CDR) lock on a received data signal by accounting for phase variations caused by changes in the physical properties of a communication link. Accordingly, the transceivers do not need to perform superfluous calibration routines with one another.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A computer-implemented method for transmitting data to a first transceiver from across a communication link, the method comprising:
   receiving a first data signal across the communication link from the first transceiver;
   sampling a first portion of the first data signal to produce sampled data;
   determining a first phase adjustment to be applied to a second portion of the first data signal to compensate for a phase variation associated with the communication link based on the sampled data;
   storing the first phase adjustment for a time interval during which no data are transmitted across the communication link to the first transceiver;
   after the time interval, applying a second phase adjustment to a second data signal based on the first phase adjustment and a phase offset, wherein the phase offset reflects a phase change caused by hardware associated with the first transceiver, to generate a phase-adjusted data signal and compensate for the phase variation associated with the communication link and the hardware associated with the first transceiver; and
   transmitting the phase-adjusted data signal across the communication link to the first transceiver.

2. The computer-implemented method of claim 1, wherein a sampling clock is configured to maintain clock data recovery (CDR) lock on the first data signal based on the first phase adjustment.

3. The computer-implemented method of claim 1, wherein the first phase adjustment comprises a positive or negative phase shift having a first magnitude, and the second phase adjustment comprises a negative or positive phase shift having substantially the first magnitude.

4. The computer-implemented method of claim 1, further comprising:
   applying a third phase adjustment to a third data signal based on the first phase adjustment and the phase offset; and
   transmitting the third data signal across the communication link to the first transceiver.

5. The computer-implemented method of claim 4, wherein the phase offset is determined by:
   transmitting a first data burst having a first phase value to the first transceiver;
   receiving a second data burst having a second phase value from the first transceiver; and
   computing the phase offset based on a phase difference between the first phase value and the second phase value, wherein the phase offset reflects a phase change caused by a hardware data pathway associated with the first transceiver.

6. The computer-implemented method of claim 1, wherein the communication link comprises a high speed, bidirectional serial data bus.

7. The computer-implemented method of claim 1, wherein the phase variation associated with the communication link arises from process-voltage-temperature (PVT) variations associated with the communication link.

8. A computer-implemented method for transmitting data to a first transceiver from across a communication link, the method comprising:
   receiving a first data signal across the communication link from the first transceiver;
   sampling a first portion of the first data signal to produce sampled data;
   determining a first phase adjustment to be applied to a second portion of the first data signal to compensate for a phase variation associated with the communication link based on the sampled data;
   storing the first phase adjustment for a time interval during which no data are transmitted across the communication link to the first transceiver;
   after the time interval, applying a second phase adjustment to a second data signal based on the first phase adjustment to generate a phase-adjusted data signal and compensate for the phase variation associated with the communication link;
   transmitting the phase-adjusted data signal across the communication link to the first transceiver;
   receiving a third data signal across the communication link from the first transceiver;
   sampling a third portion of the third data signal to produce additional sampled data;
   determining a third phase adjustment to be applied to a fourth portion of the third data signal to compensate for the phase variation associated with the communication link based on the additional sampled data;
   determining that the third phase adjustment does not exceed a threshold value, wherein the third phase adjustment is stored as a phase offset; and
   transmitting a fourth data signal across the communication link to the first transceiver without compensating for the phase variation associated with the communication link, wherein the phase offset reflects the phase variation, and wherein a sampling clock within the first transceiver is configured to maintain clock data recovery (CDR) lock on the fourth data signal.

9. A non-transitory computer-readable medium storing program instructions that, when executed by a processing unit, cause the processing unit to transmit data to a first transceiver from across a communication link, by performing the steps of:
   receiving a first data signal across the communication link from the first transceiver;
   sampling a first portion of the first data signal to produce sampled data;
   determining a first phase adjustment to be applied to a second portion of the first data signal to compensate for a phase variation associated with the communication link based on the sampled data;
   storing the first phase adjustment for a time interval during which no data are transmitted across the communication link to the first transceiver;
   after the time interval, applying a second phase adjustment to a second data signal based on the first phase adjustment and a phase offset, wherein the phase offset reflects a phase change caused by hardware associated with the first transceiver, to generate a phase-adjusted data signal and compensate for the phase variation associated with the communication link and the hardware associated with the first transceiver; and
   transmitting the phase-adjusted data signal across the communication link to the first transceiver.

10. The non-transitory computer-readable medium of claim 9, wherein a sampling clock is configured to maintain clock data recovery (CDR) lock on the first data signal based on the first phase adjustment.

11. The non-transitory computer-readable medium of claim 9, wherein the first phase adjustment comprises a positive or negative phase shift having a first magnitude, and the second phase adjustment comprises a negative or positive phase shift having substantially the first magnitude.

12. The non-transitory computer-readable medium of claim 9, further comprising the steps of:

applying a third phase adjustment to a third data signal based on the first phase adjustment and the phase offset; and transmitting the third data signal across the communication link to the first transceiver.

13. The non-transitory computer-readable medium of claim 12, wherein the phase offset is determined by:

transmitting a first data burst having a first phase value to the first transceiver;

receiving a second data burst having a second phase value from the first transceiver; and computing the phase offset based on a phase difference between the first phase value and the second phase value, wherein the phase offset reflects a phase change caused by a hardware data pathway associated with the first transceiver.

14. The non-transitory computer-readable medium of claim 9, wherein the communication link comprises a high speed, bidirectional serial data bus.

15. The non-transitory computer-readable medium of claim 9, wherein the phase variation associated with the communication link arises from process-voltage-temperature (PVT) variations associated with the communication link.

16. A non-transitory computer-readable medium storing program instructions that, when executed by a processing unit, cause the processing unit to transmit data to a first transceiver from across a communication link, by performing the steps of:

receiving a first data signal across the communication link from the first transceiver;

sampling a first portion of the first data signal to produce sampled data;

determining a first phase adjustment to be applied to a second portion of the first data signal to compensate for a phase variation associated with the communication link based on the sampled data;

storing the first phase adjustment for a time interval during which no data are transmitted across the communication link to the first transceiver;

after the time interval, applying a second phase adjustment to a second data signal based on the first phase adjustment to generate a phase-adjusted data signal and compensate for the phase variation associated with the communication link;

transmitting the phase-adjusted data signal across the communication link to the first transceiver;

receiving a third data signal across the communication link from the first transceiver;

sampling a third portion of the third data signal to produce additional sampled data;

determining a third phase adjustment to be applied to a fourth portion of the third data signal to compensate for the phase variation associated with the communication link based on the additional sampled data;

determining that the third phase adjustment does not exceed a threshold value, wherein the third phase adjustment is stored as a phase offset; and transmitting a fourth data signal across the communication link to the first transceiver without compensating for the phase variation associated with the communication link, wherein the phase offset reflects the phase variation, and wherein a sampling clock within the first transceiver is configured to maintain clock data recovery (CDR) lock on the fourth data signal.

17. A computing device configured to transmit data to a first transceiver from across a communication link, including:

a processor configured to:

receive a first data signal across the communication link from the first transceiver;

sample a first portion of the first data signal to produce sampled data;

determine a first phase adjustment to be applied to a second portion of the first data signal to compensate for a phase variation associated with the communication link based on the sampled data;

store the first phase adjustment for a time interval during which no data are transmitted across the communication link to the first transceiver;

after the time interval, apply a second phase adjustment to a second data signal based on the first phase adjustment and a phase offset, wherein the phase offset reflects a phase change caused by hardware associated with the first transceiver, to generate a phase-adjusted data signal and compensate for the phase variation associated with the communication link and the hardware associated with the first transceiver; and transmit the phase-adjusted data signal across the communication link to the first transceiver.

18. The computing device of claim 17, further including:

a memory unit coupled to the processor and storing program instructions that, when executed by the processor, cause the processor to:

receive the first data signal;

sample a first portion of the first data signal to produce sampled data;

determine the first phase adjustment;

store the first phase adjustment for a time interval during which no data are transmitted across the communication link to the first transceiver;

after the time interval, apply the second phase adjustment to the second data signal; and transmit the phase-adjusted data signal across the communication link to the first transceiver.

19. The computing device of claim 17, wherein a sampling clock is configured to maintain clock data recovery (CDR) lock on the first data signal based on the first phase adjustment.

20. The computing device of claim 17, wherein the first phase adjustment comprises a positive or negative phase shift having a first magnitude, and the second phase adjustment comprises a negative or positive phase shift having substantially the first magnitude.

\* \* \* \* \*